US006296705B1

(12) United States Patent
Ireland et al.

(10) Patent No.: US 6,296,705 B1
(45) Date of Patent: Oct. 2, 2001

(54) MASKING FIXTURE AND METHOD

(75) Inventors: Dennis M. Ireland, East Haddam; Walter E. Olson, Vernon, both of CT (US); Ryan H. Sleight, Columbia, MD (US); Peter L. Barilovich, Meriden, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 09/461,579

(22) Filed: Dec. 15, 1999

(51) Int. Cl.[7] .................................................... C23C 16/00

(52) U.S. Cl. ........................ 118/505; 118/717; 118/72 D; 118/721; 118/728; 118/500; 118/503; 118/504

(58) Field of Search .................................... 118/717, 720, 118/721, 723 VE, 728, 500, 503, 504, 505

(56) References Cited

U.S. PATENT DOCUMENTS

| | | | | |
|---|---|---|---|---|
| 3,801,357 | * | 4/1974 | Baldi | 117/107.2 P |
| 3,903,338 | * | 9/1975 | Cook et al. | 427/444 |
| 3,904,789 | | 9/1975 | Speirs et al. | 427/253 |
| 4,041,196 | * | 8/1977 | Baldi et al. | 427/252 |
| 4,464,430 | | 8/1984 | Baldi | 428/201 |
| 4,530,861 | | 7/1985 | Sippel et al. | 427/444 |
| 4,617,202 | | 10/1986 | Baldi | 427/253 |
| 4,845,139 | | 7/1989 | Baldi | 524/407 |
| 4,978,558 | | 12/1990 | Lamm | 427/250 |
| 5,194,219 | * | 3/1993 | Baldi | 419/45 |
| 5,225,246 | | 7/1993 | Beers et al. | 427/252 |
| 5,334,417 | | 8/1994 | Rafferty et al. | 427/253 |
| 5,368,888 | | 11/1994 | Rigney | 427/237 |
| 5,565,035 | | 10/1996 | Sylvestro et al. | 118/721 |
| 5,792,267 | | 8/1998 | Marszal et al. | 118/500 |
| 5,800,695 | | 9/1998 | Kang et al. | 205/135 |
| 6,224,673 | * | 5/2001 | Das et al. | 118/500 |

* cited by examiner

*Primary Examiner*—Jeffrie R. Lund
(74) *Attorney, Agent, or Firm*—Kenneth C. Baran

(57) ABSTRACT

A fixture for selectively masking a turbine blade 60 includes a locator 10 with a separable receptacle 40 having portals 50. Guide bars 18 extend from the locator for guiding a pair of shield carriers 20 between deployed and retracted positions. Each shield carrier has a shield 26 projecting therefrom. In use, a turbine blade 60, whose root 70 includes a fir tree attachment 72 and a damper pocket 74, is mounted on the fixture so that the receptacle embraces the blade root. The shield carriers are translated along the guide bars until the shields penetrate through the portals and into the receptacle thus segregating the attachment 72 from the damper pocket 74. Masking powder 84 is then compressed into the receptacle to envelop the attachment while leaving the damper pocket unmasked. The fixture facilitates selective masking of the blade root so that when the receptacle and masked blade are subsequently exposed to a metal bearing vapor at an elevated temperature, the vapor coats the damper pocket but not the highly stressed attachment. In one variant of the invention, the shields are independent, consumable shields dimensioned and shaped to substantially conform to the size and shape of the damper pocket. The shields are made of a thermally decomposable material. In use, the shields are wedged into the damper pockets prior to blade masking. During the coating cycle, the shields decompose at a temperature lower than the temperature at which coating vapors are produced to expose the damper pocket to the vapors.

13 Claims, 5 Drawing Sheets

MASKING FIXTURE AND METHOD

TECHNICAL FIELD

This invention relates to fixtures for selectively asking an article prior to applying a protective coating to the unmasked surfaces thereof.

BACKGROUND OF THE INVENTION

The turbine module of a gas turbine engine includes one or more arrays of blades, typically made of a nickel alloy, for extracting energy from a working medium fluid. Each blade comprises a platform with radially inner and outer surfaces, an airfoil that extends from the platform outer surface, and a root that extends from the platform inner surface. The root includes an attachment with "fir tree" teeth and may also include a damper pocket intermediate the platform and the fir tree attachment and defined in part by the platform inner surface. When installed in a turbine module, the fir tree teeth of each blade engage a corresponding fir tree slot in a rotatable turbine disk so that the platforms collectively define the radially inner boundary of an annular, working medium flowpath and the airfoil of each blade spans radially across the flowpath. Each damper pocket cooperates with the rim of the disk to confine a sheet metal vibration damper.

During engine operation, the airfoils and radially outer surfaces of the blade platforms are directly exposed to hot, working medium gases and are therefore susceptible to accelerated oxidation and corrosion. Accordingly, blade manufacturers apply a protective aluminide coating to both the airfoil and the radially outer surface of each platform. By contrast, the blade root and platform inner surface are normally left uncoated since they usually operate in an environment less conducive to accelerated oxidation and corrosion and since the presence of an aluminide coating could degrade the fatigue life of the attachment teeth and other highly stressed regions of the root.

The aluminide coating may be applied by conventional vapor deposition after the blade root and platform inner surface have been masked as described below. The masked blade is placed in a loosely covered coating vessel along with nuggets of an aluminum source material and a halide activator. The vessel and its contents are heated to an elevated temperature to vaporize the aluminum. Concurrently, an inert carrier gas (e.g. argon) is continuously pumped into the vessel to circulate the aluminum vapor and deposit the gaseous aluminum onto the unmasked blade surfaces where the deposited aluminum diffuses into the nickel alloy substrate.

Masking of the blade root and platform inner surface is accomplished with a coating box and a metallic masking powder. A typical coating box comprises a rectangular end plate with four walls extending perpendicularly therefrom to form a five-sided enclosure with an open end opposite the end plate. The end plate includes a window slightly smaller than the planform of the blade platform and at least partially bordered by ledges. The blade is mounted on the end plate so that the platform rests on the ledges and covers the opening and so that the blade root projects into the box interior. The masking powder is then introduced into the box through its open end and compressed around the blade root to completely envelop the root and shield the inner surface of the platform. The box and blade, with the blade root completely enveloped by masking powder and the airfoil projecting beyond the end plate, are placed in the coating vessel and the blade is coated as described above. During the coating cycle, the masking powder reacts with the coating vapor to prevent aluminum deposition on the masked surfaces.

The above described masking and coating procedures are effective when it is desired to protectively coat the flowpath exposed blade surfaces while precluding coating deposition on the root and platform inner surface. However, in some applications the damper pocket may operate in a temperature range conducive to hot corrosion (approximately 700° C. to 900° C.) and therefore may require a protective aluminide coating. Because the damper pocket is only moderately stressed, it is feasible to apply a protective aluminide coating to the damper pocket without incurring a detrimental reduction in fatigue life.

One way to selectively apply an aluminide coating to the damper pocket is to first mask and coat the blade as described above and to subsequently apply a coating precursor, in the form of a diffusible aluminide slurry, to the damper pocket surfaces. The blade is then once again heated to an elevated temperature to diffuse the aluminum content of the slurry into the substrate alloy. Although this method is effective, precisely applying the slurry to the selected surfaces is labor intensive and thus escalates the cost of coating the blade. Moreover, the added step of reheating the blade adds to the time required to complete the entire coating process.

Another way to achieve the desired selective coating application is to press an adherable aluminide coating tape into the damper pocket before mounting the blade in the coating box. The masking powder then masks the blade as before, except for those areas in contact with the tape. When the blade is heated inside the coating vessel to deposit the coating vapor on the airfoil and the platform outer surface, the aluminum content of the tape concurrently diffuses into the damper pocket. Although this method achieves the desired result, application of the tape is an exacting, time consuming process and the tape itself adds to the cost of coating the blade.

What is needed is a method and apparatus for selectively masking an article prior to depositing a coating on unmasked portions thereof, and particularly a convenient, cost effective and labor saving means for masking selected portions of a turbine blade root.

SUMMARY OF THE INVENTION

According to the invention, a masking fixture includes a locator with a masking powder receptacle that embraces a portion of a workpiece to be selectively masked and a shield, deployable into the receptacle, for shielding a selected subregion of the embraced portion from contact with the powder.

According to one aspect of the invention, the shield is attached to a shield carrier movable between deployed and retracted positions. An associated inventive method of selectively applying a masking powder to the root region of a turbomachinery blade includes the steps of placing the blade root into the receptacle, dividing the internal volume of the receptacle into individual chambers and introducing masking powder into fewer than all of the chambers.

According to another aspect of the invention, the shield is an independent, stand-alone shield made of a thermally decomposable material. A related inventive method includes the steps of wedging the consumable shield into the damper pocket, mounting the blade on a receptacle so that the shield occupies substantially the entire damper pocket and the root projects into the interior of the receptacle, and introducing masking powder into the receptacle so that the masking powder envelops the attachment portion of the root without entering the damper pocket. During subsequent heating of the receptacle and blade, the consumable shield thermally decomposes to expose the damper pocket to coating vapors.

The principal advantage of the invention is the ease with which a masking powder can be applied to a predefined subregion of that portion of the workpiece embraced by the receptacle. In the context of masking a turbine blade, the principal advantage is the ease with which masking powder can be applied exclusively to the attachment region of the blade root so that the blade damper pocket may be subsequently exposed to coating vapor. In comparison to the past practices of custom coating a previously masked damper pocket or applying a coating tape to the damper pocket prior to masking, the invention offers a significant savings in labor and/or material costs and reduces the time required to process a blade.

BEST MODE FOR CARRYING OUT THE INVENTION

Figure 1:
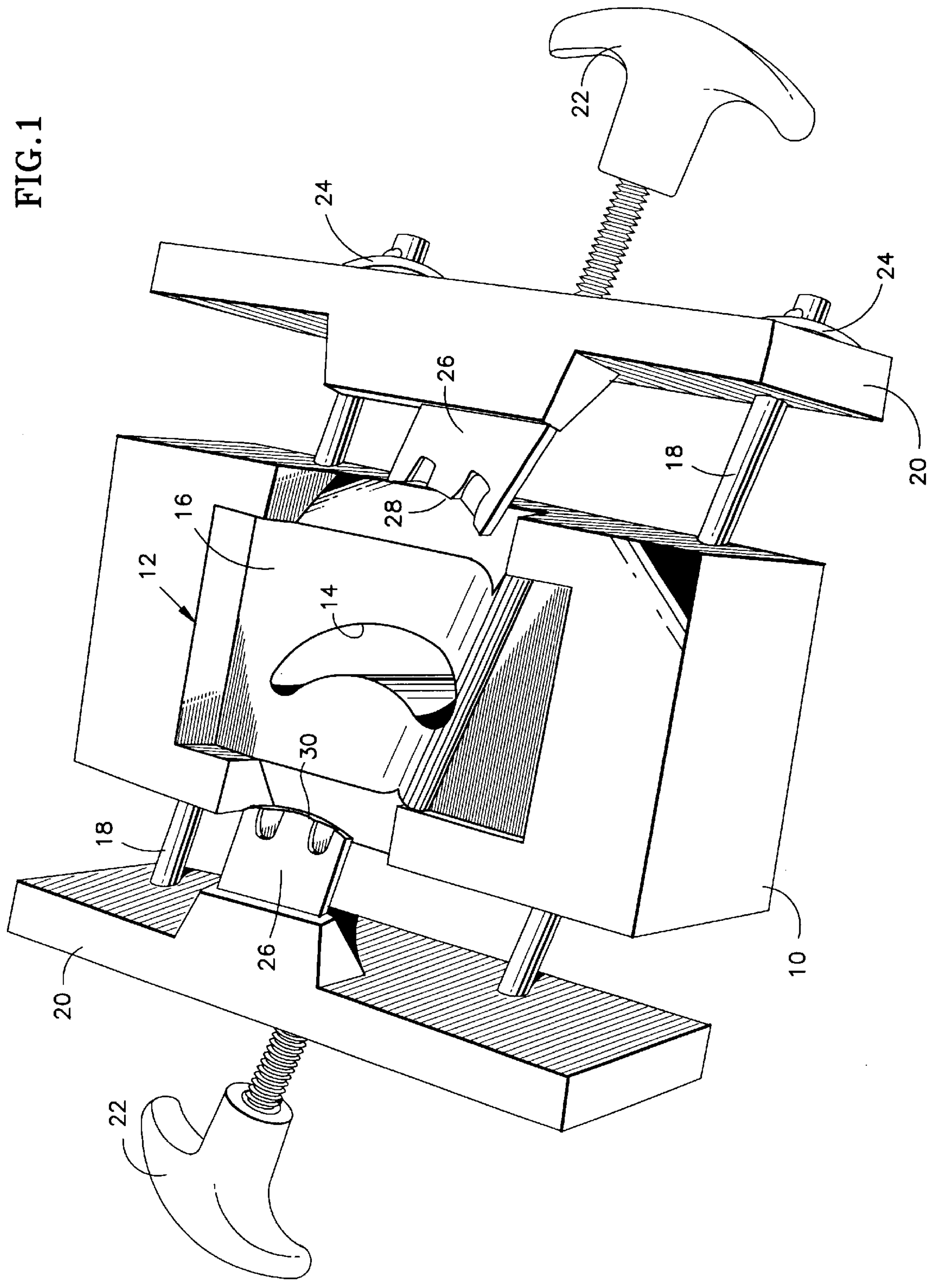
FIG. 1 is a perspective view of the fixture with the masking powder receptacle not shown.
Figure 2:
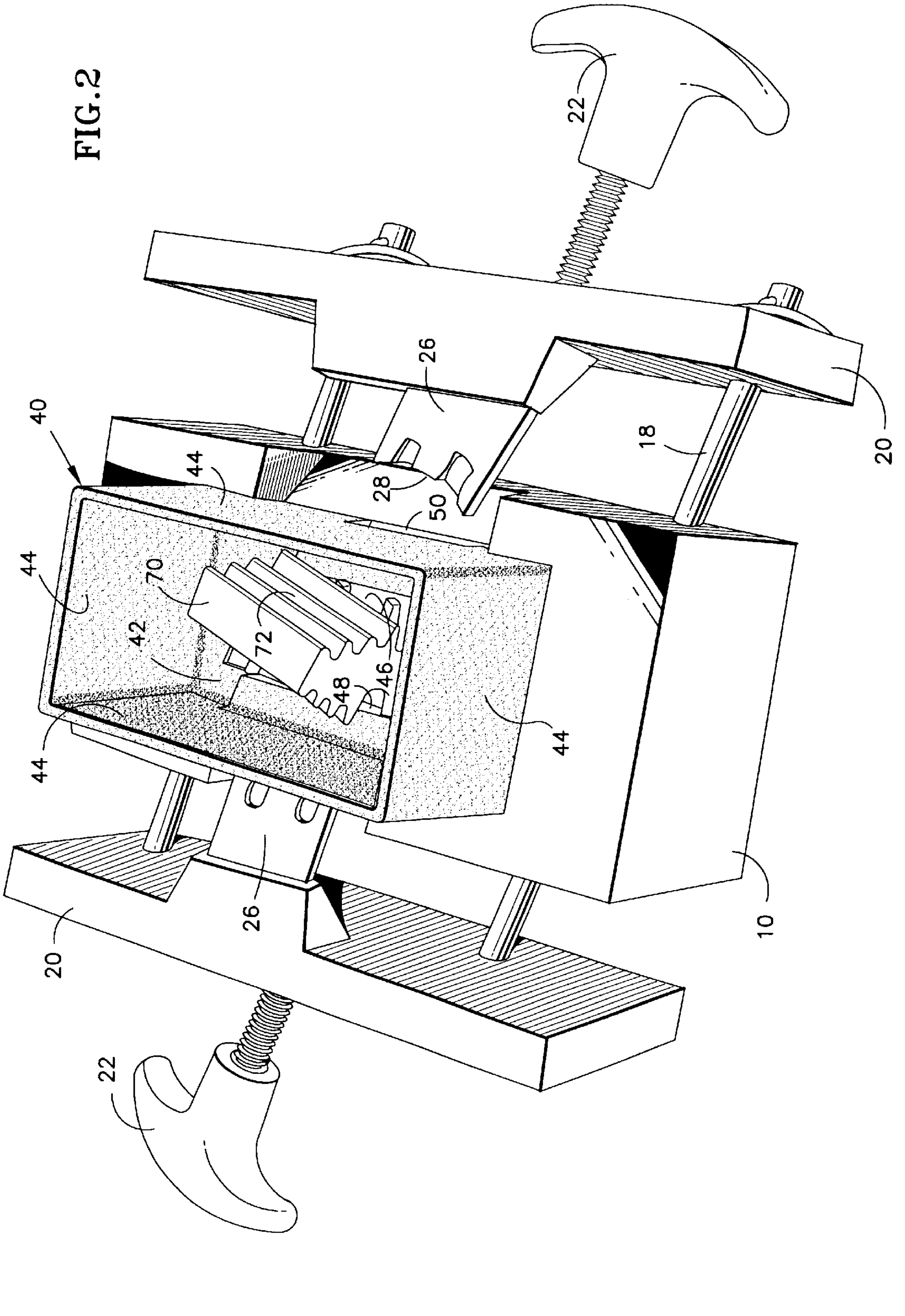
FIG. 2 is a view similar to that of FIG. 1 showing the receptacle resting on the locator and illustrating a turbine blade root projecting into the interior of the receptacle.
Figure 3:
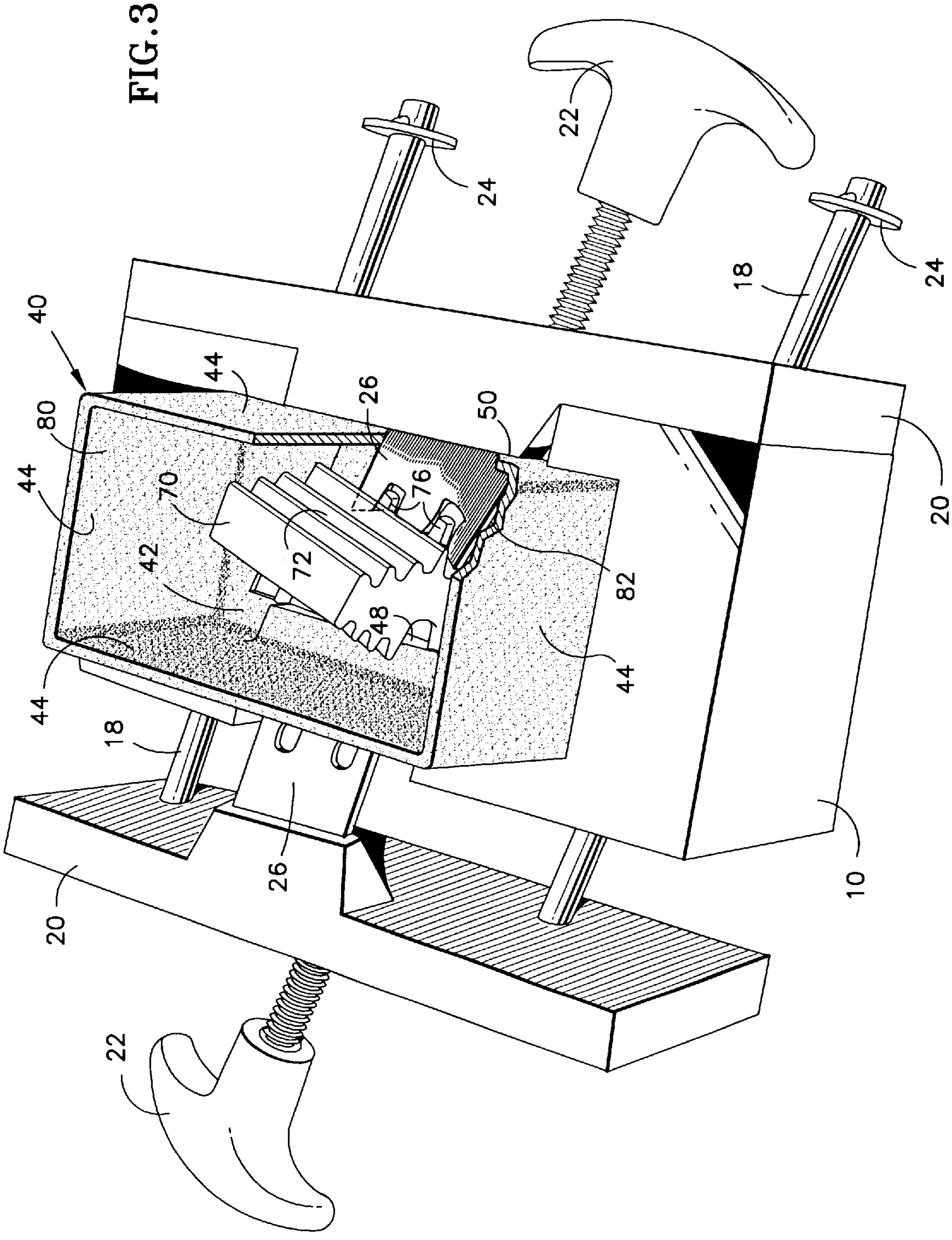
FIG. 3 is a view similar to that of FIG. 2 with one of two shields in its deployed position.

Referring to FIGS. 1, 2 and 3, a fixture for selectively masking a turbine blade for a gas turbine engine includes a locator 10 made of thermoset polyurethane and having a rectangular depression 12 formed in one of its surfaces. An airfoil shaped aperture 14 extends through the locator from the floor 16 of the depression. A set of stationary guide bars 18 extends from the sides of the locator. Shield carriers 20 with handles 22 are slidably mounted on the guide bars so that the carriers are translatable between a retracted position and a deployed position, both of which are shown in FIG. 3. Washers 24 or other suitable retainers are mounted on the guide bars to prevent the carrier from slipping off the bars. A shield 26 integral with or otherwise attached to each carrier projects from each carrier. In the illustrated fixture, one shield has a concave tip 28 and the other has a convex tip 30.

The fixture may also include a receptacle 40 capable of holding a quantity of masking powder. Ideally, the receptacle is separable from the locator rather than being an integral part thereof. In the illustrated embodiment, the receptacle is a conventional, metallic coating box having an end plate 42 and four walls 44 extending perpendicularly therefrom to form a five sided enclosure with an open end opposite the end plate. The end plate has a window 46 bordered by ledges 48. Two opposing walls of the receptacle are locally interrupted to define portals 50. The receptacle is precoated with an aluminide coating to minimize the amount of coating vapor that will be attracted to and deposited on the receptacle itself during operations intended to coat a turbine blade.

Figure 4:
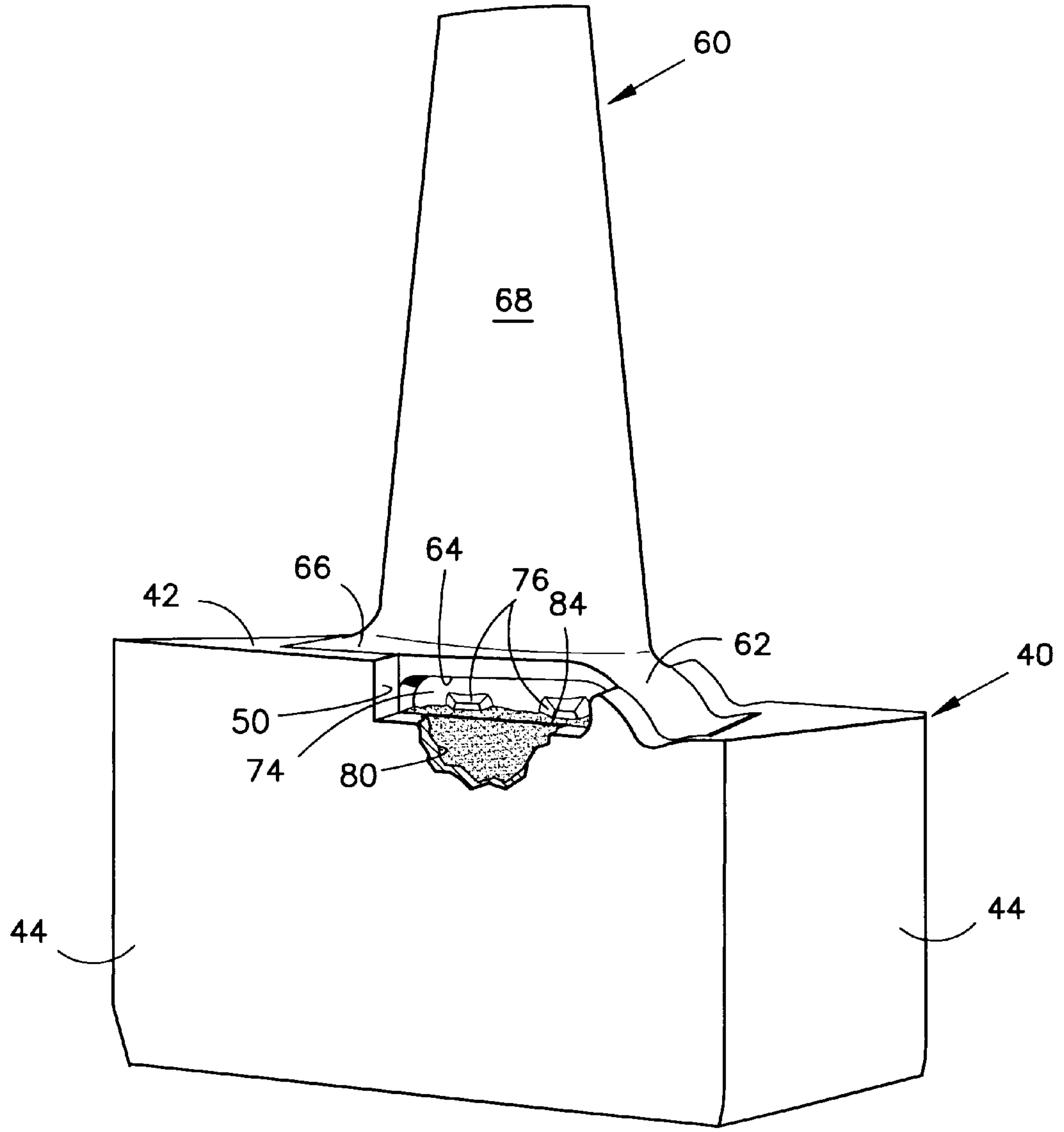
FIG. 4 is a view of the receptacle with a turbine blade mounted thereon, the receptacle being partially broken away to illustrate masking powder enveloping the blade attachment without contacting the blade damper pocket.

Referring primarily now to FIGS. 2 and 4, an uncoated blade 60 includes a platform 62 having radially inner and outer surfaces 64, 66, an airfoil 68 extending from the outer surface and a root 70 extending from the inner surface. The root comprises a fir tree type attachment 72 (FIG. 2) and a damper pocket 74 (FIG. 4) intermediate the platform and the attachment and defined in part by the platform inner surface 64. Support lugs 76 project from the root. When the blade is secured to a turbine disk in a gas turbine engine, the damper pocket cooperates with the disk rim to confine a sheet metal vibration damper with the lugs helping to support the damper.

To use the fixture, a technician mounts the uncoated blade on the end plate 42 by inserting the blade root 70 through the receptacle window 46 until the platform contacts the ledges 48 and the platform outer surface is flush with the external surface of the end plate as seen best in FIG. 4. The airfoil 68 projects beyond the end plate in a direction opposite to that of the root. With the blade properly positioned, the receptacle embraces the blade root, which is the portion of the blade to be selectively masked. The technician then installs the receptacle in the depression 16 of the locator so that the platform outer surface 66 rests on the locator floor 16 and the airfoil projects into the airfoil shaped aperture 14.

The technician then slides the translatable shield carriers 20 from their retracted position (FIGS. 1 and 2) to their deployed position, illustrated by the carrier with the concavely shaped shield in FIG. 3, so that the shields 26 project through the portals 50 and penetrate into the interior of the receptacle. When fully deployed, the concave and convex tips 28, 30 of the shields contact respective convex and concave contours on the blade root to divide the internal volume of the receptacle into an attachment chamber 80 and a damper pocket chamber 82, the attachment chamber being bounded by the blade attachment 72, the receptacle walls 44, and the sides of the shields visible in FIG. 3, and the damper pocket chamber being bounded by the surfaces of the damper pocket 74 and the sides of the shields nonvisible in FIG. 3. Thus, the shields establish an interface between predefined and predesignated subregions of the blade root, the predefined subregion being the attachment, and the predesignated subregion being the damper pocket, including the platform inner surface.

The technician then introduces masking powder into the attachment chamber by way of the open end of the receptacle and, with the assistance of a pneumatic ram, compresses the powder into the attachment chamber so that the powder envelops the attachment. Finally, the technician withdraws the shields from the receptacle by pulling on the carrier handles 22 and removes the receptacle 40 from the locator 10. As seen in FIG. 4, the powder 84, now tightly compacted, envelops the attachment 72, but remains out of contact with the damper pocket 74. As a result, when the blade and receptacle are exposed to coating vapors, those vapors enter the damper pocket by way of the portals 50 and coat the damper pocket.

Figure 6:
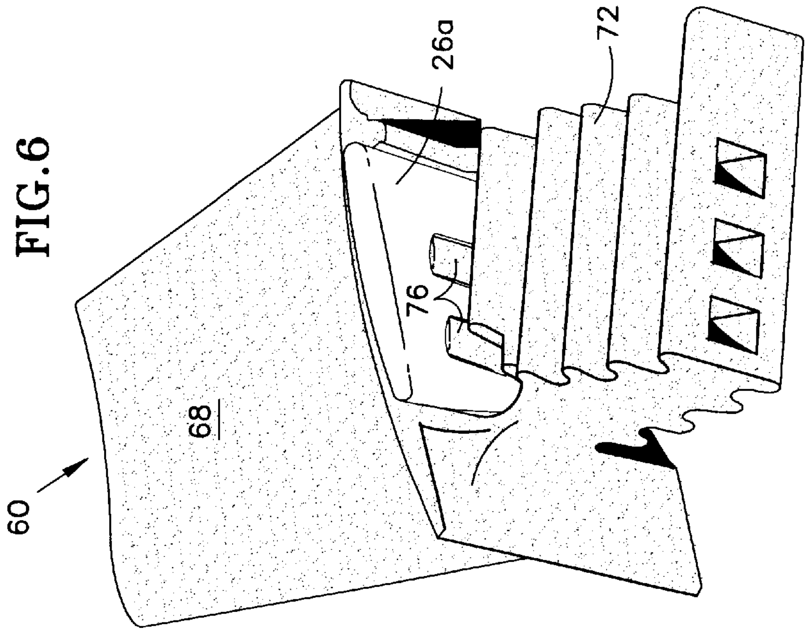
FIG. 6 is a view similar to FIG. 5 with the consumable shield wedged into the blade damper pocket.
Figure 5:
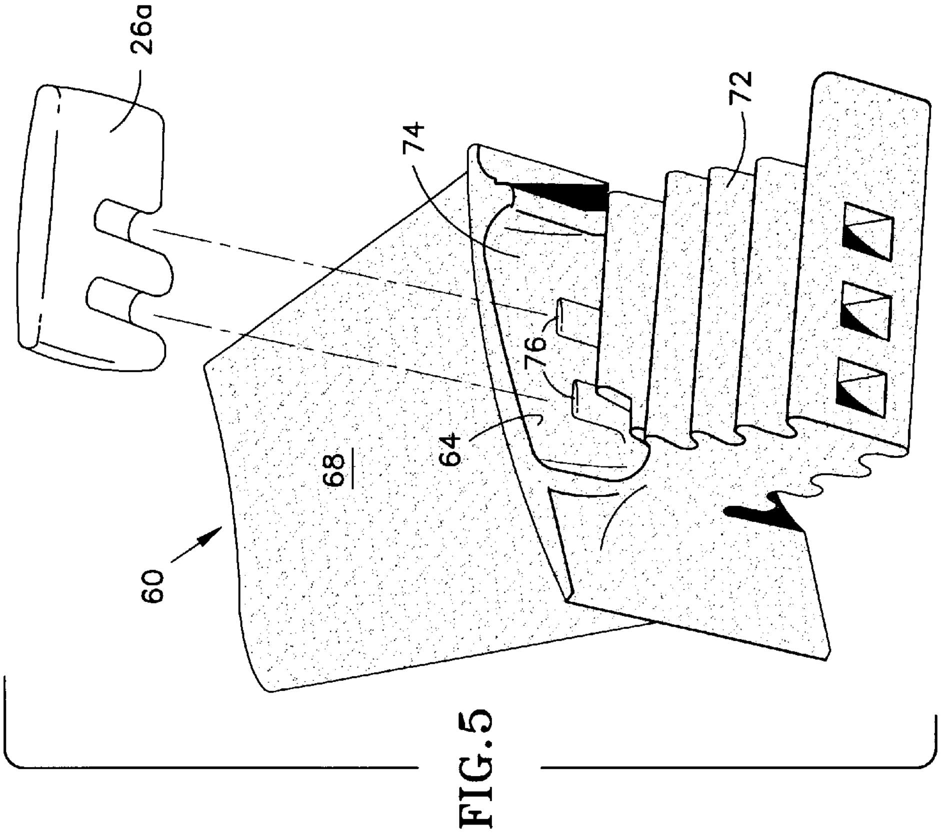
FIG. 5 is a view showing an independent, consumable shield in relation to a turbine blade.

According to another aspect of the invention and as seen in FIGS. 5 and 6, the shield carriers 20 and guide bars 18 may be dispensed with and the shields may be independent, consumable shields 26*a* made of a material such as polyethylene that decomposes at an elevated temperature lower than the temperature at which the aluminum vapors are produced during vapor deposition. The independent shields are dimensioned and shaped so that they substantially conform to the size and shape of the damper pocket 74 and can be securely wedged into the damper pocket, i.e. into the space between the platform inner surface 64 and the damper support lugs 76. The independent shields are particularly useful and convenient when the damper pocket is relatively narrow in the spanwise direction.

To use the independent shields, a technician wedges the shields into the damper pocket 74, i.e. into the space intermediate the damper support lugs 76 and the platform inner surface 64. Because the shields substantially conform to the size and shape of the damper pocket, they occupy substantially the entire volume of the pocket. Once the shields are wedged into place, the technician mounts the uncoated blade on the receptacle end plate 42, as described above, so that the receptacle embraces the root and the independent shields occupy substantially the entire volume of the damper pocket, thereby defining the interface between the damper pocket, which is to be coated, and the attachment, which is to be left uncoated. The masking powder is then compressed into the receptacle as before so that the powder envelops the attachment without entering the damper pocket. The receptacle, with the attachment enveloped by masking powder and the airfoil projecting beyond the end plate, are then heated to an elevated coating temperature in the presence of an aluminum source material and a halide activator to effect aluminum deposition onto the unmasked blade surfaces. Prior to attainment of the coating temperature, the shields thermally decompose to expose the damper pocket to the coating vapors. The polyethylene material used to make the illustrated shields, decomposes at about 700° C., well below the coating temperature of about 1020° C.

In view of the foregoing, certain additional features of the fixture may now be appreciated. The slidably mounted shield carriers 20 seen in FIGS. 1–3, while not essential, are often desirable especially if the shields are relatively thin in comparison to the spanwise dimension of the damper pocket and therefore cannot be securely wedged into the damper pocket. The carriers ensure that the deployed shields bear a prescribed positional relationship to the blade so that the interface between the predefined and predesignated subregions of the root can be repeatably established on a succession of substantially identical blades being masked prior to coating. The carrier also helps to stabilize the shields when the masking powder is tightly compacted into the attachment chamber 80 by a pneumatic ram. In addition, the guide bars 18 are obliquely oriented to govern the angle at which the shields enter the portals and thus ensure correct, repeatable orientation of the shields relative to the blade root so that the shields can prevent masking powder from entering the damper pocket chamber. Furthermore, the receptacle is ideally a conventional coating box, separable from the locator, so that only the coating box need be made of a material capable of withstanding the high temperatures encountered during vapor deposition. In the illustrated embodiment, the shields, shield carrier and locator are made of thermoset polyurethane.

The consumable, independent shields may be more advantageous in situations where the damper cavity is a relatively narrow space. Since the independent shields are securely wedged into the damper cavity, they inherently bear a prescribed positional relationship to the blade without the assistance of carriers and remain in position even when the masking powder is packed into the receptacle.

As is evident, the disclosed fixture dispenses with any need to conduct a second coating operation to the blade damper pockets or to apply a coating tape to the pocket prior to masking. As a result blade masking and coating operations can be conducted both quickly and cost effectively.

Although the invention has been described with reference to a preferred embodiment thereof, those skilled in the art will appreciate that various changes, modifications and adaptations can be made without departing from the invention as set forth in the accompanying claims.

We claim:

1. A fixture for selectively masking a workpiece with a masking powder, comprising:

a locator with a receptacle for holding the workpiece, the receptacle embracing a portion of the workpiece to be selectively masked; and a shield deployable into the interior of the receptacle for establishing an interface between a predesignated subregion of the workpiece portion to be shielded from contact with the masking powder and a predefined subregion to be exposed to the masking powder.

2. The fixture of claim 1 wherein the receptacle is separable from the locator.

3. The fixture of claim 1 wherein the receptacle includes a portal to accommodate deployment of the shield into the interior of the receptacle.

4. The fixture of claim 1 comprising a shield carrier having the shield attached thereto, the carrier being movable relative to the receptacle between a retracted position and a deployed position in which the shield bears a prescribed positional relationship to the workpiece for defining the interface between the predefined and predesignated subregions.

5. The fixture of claim 4, comprising a shield carrier guide for guiding movement of the carrier between the retracted and deployed positions.

6. A fixture for selectively masking a workpiece with a masking powder, comprising:

a locator having means for holding a masking powder receptacle;

a guide bar extending from the locator;

a shield carrier slidably mounted on the guide bar; and a shield projecting from the shield carrier.

7. The fixture of claim 6 wherein the holding means is a depression formed in the locator.

8. The fixture of claim 6 wherein the locator includes an aperture for accommodating a projecting portion of the workpiece.

9. A fixture for selectively masking a turbomachinery blade, the blade having a platform, an airfoil extending outwardly from the platform and a root extending inwardly from the platform, the root having an attachment for coupling the blade to a turbomachinery disk and a damper pocket intermediate the platform and the attachment, the fixture comprising:

a locator with a depression therein;

a receptacle installable in and removable from the depression so that the locator and receptacle hold the blade in a position with the root embraced by the receptacle;

a shield carrier slidably mounted on guide bars that extend from the locator, the carrier being translatable between a retracted position and a deployed position; and a shield projecting from the shield carrier so that in the deployed position the shield projects into the interior of the receptacle and segregates the attachment from the damper pocket to shield the damper pocket from masking powder introduced into the receptacle.

10. The fixture of claim 9 wherein the locator includes an aperture for accommodating the airfoil.

11. A masking shield for selectively masking a damper pocket region of a turbomachinery blade, the shield being dimensioned and shaped to substantially conform to the size and shape of the damper pocket, the shield being consumable at a first temperature lower than a second temperature at which coating vapors are produced during vapor deposition of a coating.

12. The shield of claim 11 wherein the shield is made of a material that is consumed by thermal decomposition.

13. The shield of claim 12 wherein the material is polyurethane.

* * * * *